(12) United States Patent
Lomax, Jr. et al.

(10) Patent No.: US 7,113,591 B2
(45) Date of Patent: Sep. 26, 2006

(54) CURRENT SENSE CIRCUIT IN A LINE POWERED NETWORK ELEMENT

(75) Inventors: Charles Weston Lomax, Jr., Raleigh, NC (US); Christopher Tad Ammann, Raleigh, NC (US); Randall L. Powers, Raleigh, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 496 days.

(21) Appl. No.: 10/449,917

(22) Filed: May 30, 2003

(65) Prior Publication Data

US 2004/0240663 A1  Dec. 2, 2004

(51) Int. Cl.
*H04M 1/00* (2006.01)

(52) U.S. Cl. .................. 379/413; 379/399.01; 379/322

(58) Field of Classification Search ................ 379/413, 379/399.01, 322
See application file for complete search history.

(56) References Cited

U.S. PATENT DOCUMENTS

| | | | |
|---|---|---|---|
| 5,953,237 A | 9/1999 | Indermaur et al. | |
| 6,199,180 B1 | 3/2001 | Ote et al. | |
| 6,208,714 B1 | 3/2001 | Brablec | |
| 6,606,383 B1* | 8/2003 | Robinson et al. | 379/93.09 |
| 6,647,116 B1* | 11/2003 | Gay | 379/93.01 |
| 6,825,726 B1 | 11/2004 | French et al. | |
| 2002/0126833 A1* | 9/2002 | Youngblood | 379/399.01 |
| 2003/0185385 A1* | 10/2003 | Boudreaux et al. | 379/387.01 |

* cited by examiner

*Primary Examiner*—Jefferey F. Harold
(74) *Attorney, Agent, or Firm*—Fogg and Associates LLC; Scott V. Lundberg

(57) ABSTRACT

Managing line power for network elements in an access network. In one embodiment a current sense system in a line power network is disclosed. The current sense system includes a power supply, a splitter and a sense circuit. The power supply is adapted to supply output current to a twisted pair drop. The splitter is adapted to combine communication signals and the output current on a twisted pair drop. The sense circuit is coupled to sample the output current of the power supply between the power supply and the splitter. The sense circuit is further adapted to output a sense signal that is representative of the output current.

25 Claims, 9 Drawing Sheets

CURRENT SENSE CIRCUIT IN A LINE POWERED NETWORK ELEMENT

TECHNICAL FIELD

The present invention relates generally to the field of telecommunications, and, in particular, to managing line power for network elements in an access network.

RELATED APPLICATIONS

This application is related to co-pending application Ser. No. 10/134,323, filed on Apr. 29, 2002 and entitled MANAGING POWER IN A LINE POWERED NETWORK ELEMENT (the '323 Application). The '323 Application is incorporated herein by reference.

This application is also related to the following application filed on even date herewith.

Application Ser. No. 10/449,910, entitled "FUNCTION FOR CONTROLLING LINE POWERED NETWORK ELEMENT," (the '358 Application).

Application Ser. No. 10/449,259, entitled "LINE POWERED NETWORK ELEMENT," (the '359 Application).

Application Ser. No. 10/449,682, entitled "ELEMENT MANAGEMENT SYSTEM FOR MANAGING LINE-POWERED NETWORK ELEMENTS," (the '360 Application).

Application Ser. No. 10/449,496, entitled "INPUT VOLTAGE SENSE CIRCUIT IN A LINE POWERED NETWORK ELEMENT," (the '590 Application).

Application Ser. No. 10/448,884, entitled "LIGHTNING PROTECTION FOR A NETWORK ELEMENT," (the '591 Application).

Application Ser. No. 10/449,546, entitled "SPLITTER," (the '592 Application).

Application Ser. No. 10/449,547, entitled "POWER RAMP-UP IN A LINE-POWERED NETWORK ELEMENT SYSTEM," (the '593 Application).

The '358, '359, '360, '590, '591, '592 and '593 applications are incorporated herein by reference.

BACKGROUND

Telecommunications networks transport signals between user equipment at diverse locations. A telecommunications network includes a number of components. For example, a telecommunications network typically includes a number of switching elements that provide selective routing of signals between network elements. Additionally, telecommunications networks include communication media, e.g., twisted pair, fiber optic cable, coaxial cable or the like that transport the signals between switches. Further, some telecommunications networks include access networks.

For purposes of this specification, the term access network means a portion of a telecommunication network, e.g., the public switched telephone network (PSTN), that allows subscriber equipment or devices to connect to a core network. For example, an access network is the cable plant and equipment normally located in a central office or outside plant cabinets that directly provides service interface to subscribers in a service area. The access network provides the interface between the subscriber service end points and the communication network that provides the given service. An access network typically includes a number of network elements. A network element is a facility or the equipment in the access network that provides the service interfaces for the provisioned telecommunication services. A network element may be a stand-alone device or may be distributed among a number of devices.

There are a number of conventional forms for access networks. For example, the digital loop carrier is an early form of access network. The conventional digital loop carrier transported signals to and from subscriber equipment using two network elements. At the core network side, a central office terminal is provided. The central office terminal is connected to the remote terminal over a high-speed digital link, e.g., a number of T1 lines or other appropriate high-speed digital transport medium. The remote terminal of the digital loop carrier typically connects to the subscriber over a conventional twisted pair drop.

The remote terminal of a digital loop carrier is often deployed deep in the customer service area. The remote terminal typically has line cards and other electronic circuits that need power to operate properly. In some applications, the remote terminal is powered locally. In some networks, the remote terminal is fed power over a line from the central office. This is referred to as line feeding or line powering and can be accomplished through use of an AC or a DC source. Thus, if local power fails, the remote terminal still functions because it is typically powered over the line using a battery-backed power source. This allows the remote terminal to offer critical functions like lifeline plain old-fashioned telephone service (POTS) even during a power outage.

Over time, the variety of services offered over telecommunications networks has changed. Originally, the telecommunications networks were designed to carry narrowband, voice traffic. More recently, the networks have been modified to offer broadband services. These broadband services include services such as digital subscriber line (DSL) services. DSL (or xDSL) is a generic name for a family of digital lines such as Asymmetrical Digital Subscriber Line (ADSL), High Bit Rate Digital Subscriber Line (HDSL) and G.SHDSL. Circuits have been designed to incorporate the xDSL, POTS and line power in a twisted pair drop. In the networks that use line powering, the line power in the twisted pair drop has to be monitored and adjusted to ensure a desired amount of current is being applied. A typical method of monitoring the current in the twisted pair drop is by splicing a sense resistor into a rail of the twisted pair drop. An op amp is then coupled across the sense resistor to provide a signal indicative of the current in the twisted pair drop. An additional power source must be provided to power the op amp. A problem with this arrangement is that if a short occurs in the circuit (an output short), the resistor will fail (burn up). To protect against shorts, a protection circuit is then added to protect the sense resistor. The cost and complexity of the sensing circuit, the additional power source for the op amp and the protection circuit is prohibitive. Moreover, prior sensing systems typically have to be coupled to a DC point in the network system which limits the flexibility of the system. It is desired in the art for an improved method of sensing the current flowing through a twisted pair drop without the disadvantages stated above.

SUMMARY

Embodiments of the present invention address problems with providing power to network elements in an access network as stated above as well as other problems known in the art. Particularly, embodiments of the present invention provide an improved current sense circuit for a line powered element.

In one embodiment, a current sense circuit in a line power network element is disclosed. The current sense circuit includes an input node, a pass node, a current to voltage conversion circuit, a rectifying circuit, a low pass filter circuit, and a signal node. The input node is coupled to receive an output current from a power supply. The pass node is coupled to pass the output current to a signal combining circuit. The current to voltage conversion circuit is coupled to the input node to provide a measurable signal proportional to the output current. The rectifying circuit is coupled to the conversion circuit. The low pass filter circuit is coupled to the rectifying circuit and the signal node coupled to the low pass filter circuit, wherein a sense signal representative of the output current is coupled to the signal node.

In another embodiment, a current sense system in a line power network is disclosed. The current sense system includes a power supply, a splitter and a sense circuit. The power supply is adapted to supply output current to a twisted pair drop. The splitter is adapted to combine communication signals and the output current on a twisted pair drop. The sense circuit is coupled to sample the output current of the power supply between the power supply and the splitter. The sense circuit is further adapted to output a sense signal that is representative of the output current.

In yet another embodiment, a method of sensing current in a twisted pair drop in a line power network is disclosed. The method comprises coupling an output current of a power supply to a sense circuit. Converting the output current to a measurable signal. Filtering the output current with a low pass filter. Outputting a sense signal that is representative of the output current of the power supply and passing the output current on to a signal combining circuit.

In further another embodiment, a method of controlling current in a twisted pair drop of a line powered network is disclosed. The method comprises generating an output current from a power supply in a network element. Coupling the output current to a splitter that is adapted to combine the output current and communication signals to a twisted pair drop in a downstream communication link. Sampling the output current between the power supply and the splitter and generating a sense signal from the sampled output current that is indicative of the output current.

BRIEF DESCRIPTION OF THE DRAWINGS

The present invention can be more easily understood and further advantages and uses thereof are more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
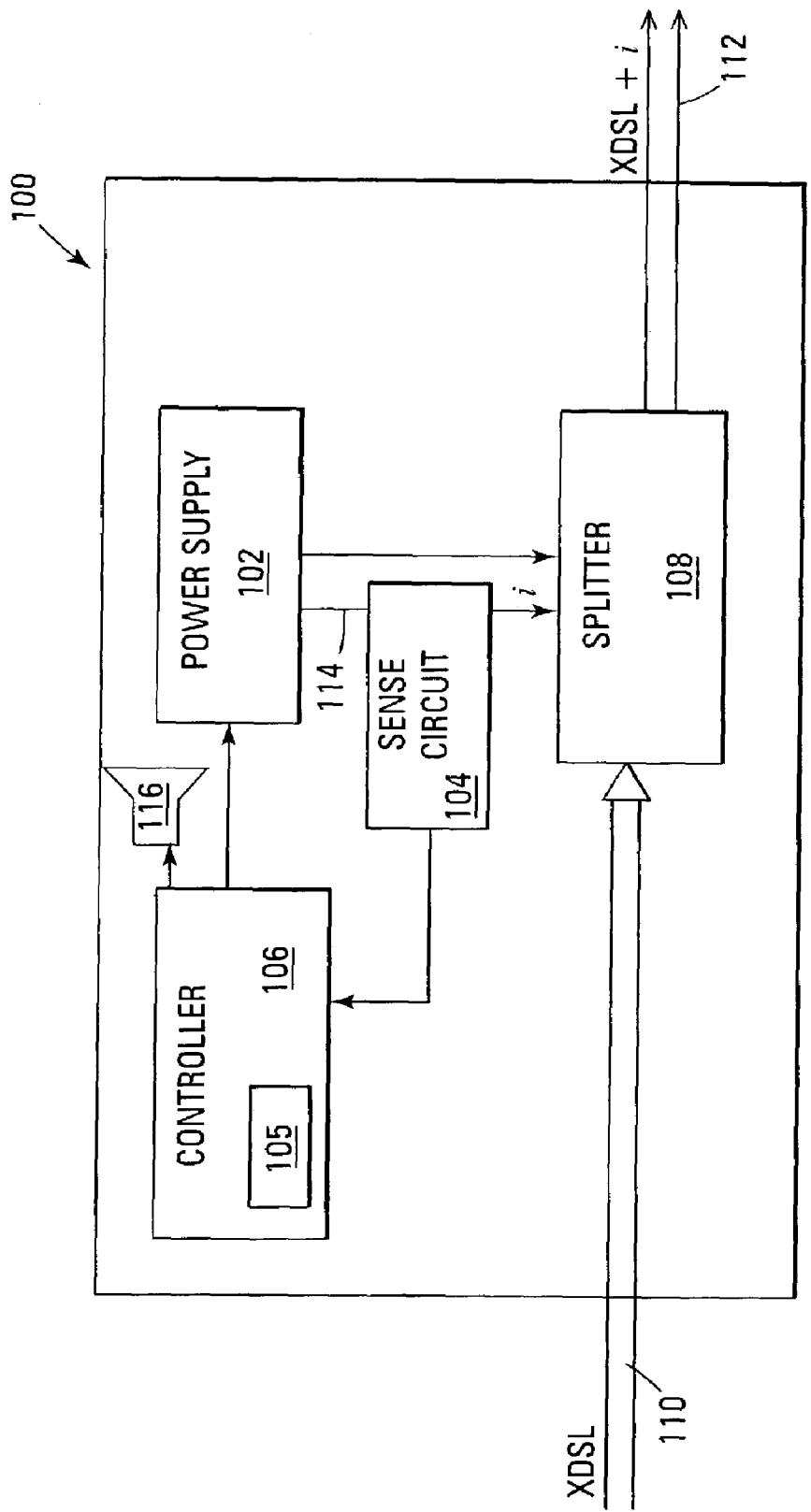
FIG. 1 is a block diagram of one embodiment of the present invention.

Embodiments of the present invention provide an improved circuit to sense the current in a twisted pair drop. Referring to FIG. 1, one embodiment of the present invention is illustrated. FIG. 1, illustrates a network element 100, in one embodiment the network element 100 is a remote terminal. In another embodiment, the network element 100 is a central office. Included in the network element 100, is a controller 106, a power supply 102, a sense circuit and a splitter 108. In one embodiment, the controller 106 controls the amount of current supplied by the power supply 102 based on a signal from the sense circuit 104. That is, the controller 106 sends one or more controller output signals to the power supply 102 to control the power supply 102. As illustrated, the sense circuit 104 is spliced in a power supply line 114 that is coupled between the power supply 102 and the splitter 108. The splitter 108 combines the current supplied by the power supply 102 and the xDSL signals from lines 110 into a twisted pair drop 112 in a downstream communication link. The splitter 108 can be generally referred to as a signal combining circuit 108 in the downstream direction. In other embodiments, the splitter 108 in the network element 100 combines xDSL and the current from the power supply 102 into a twisted pair drop. Also illustrated in the embodiment of FIG. 1, is the controller 106 having a comparator circuit 105. The comparator circuit 105 in this embodiment compares a sense signal from the sense circuit 104 with one or more reference signals.

Figure 2:
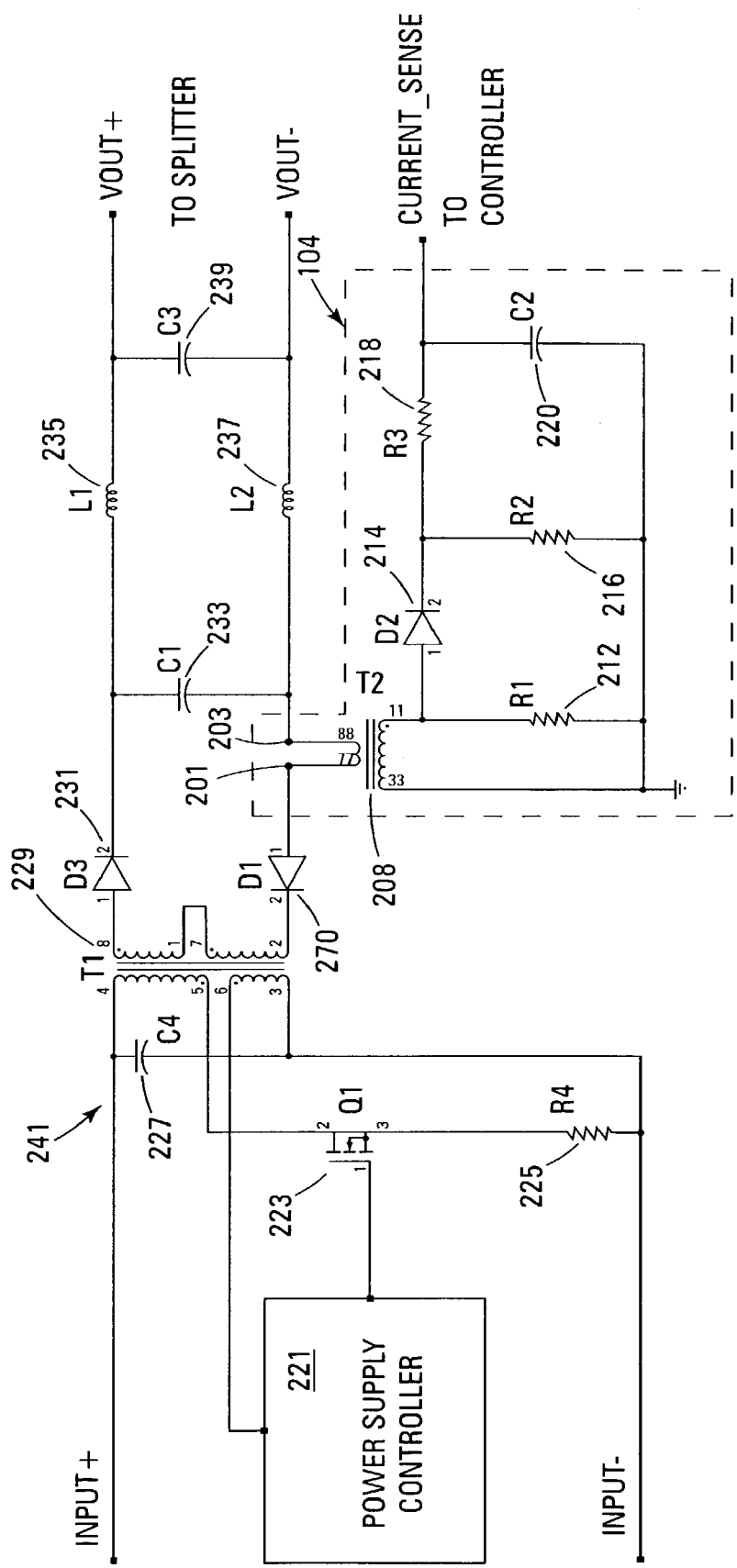
FIG. 2 is a schematic diagram of one embodiment of a sense circuit of the present invention.

Referring to FIG. 2, one embodiment of a sense circuit 104 of the present invention is illustrated. As illustrated the sense circuit receives an output current from a power supply at node 201 and passes the output current to node 203. A primary coil of transformer 208 is coupled between node 201 and 203. In one embodiment, the primary coil of the current sense transformer 208 comprises one turn. The current sense transformer 208 provides an output voltage across resistors 212 and 216 that is proportional to the rectified current in the output of the power supply. The current sense transformer 208 and resistors 212 and 216 can be generally referred to as a current to voltage converter circuit. This current is a triangle waveform, and is filtered to provide a DC signal proportional to the DC output of the power supply at capacitor 220. The waveform is filtered by a low pass filter. The low pass filter includes resistor 218 and capacitor 220 as illustrated in FIG. 2. Capacitor 220 can be referred to as a DC filter capacitor 220. In addition, node 203 is coupled to the splitter 108 to allow output current from the power supply 102 to pass to the splitter 108. The sense circuit 104 further includes rectifying diode 214 which is further discussed below. Accordingly, as illustrated in this embodiment, an output of the power supply 192 is sensed by the sense circuit 104 and the sense circuit 104 provides a sense signal to the controller 106 that has a measured DC value that is proportional to the output current of the power supply 102.

Also illustrated in FIG. 2, is power circuitry 241 of one embodiment of the present invention that provides the output signal to the sense circuit 104 and to the splitter 108. As illustrated, in this embodiment, a power supply controller 221 is coupled to switch 223 and a primary coil of transformer 229. Also illustrated is resistor 225 coupled between an −input and the switch 223. Moreover, capacitor 227 is coupled between +input and the −input. The secondary coils of the transformer 229 are respectfully coupled to diode 231 and diode 270. Further illustrated in FIG. 2 is capacitors 233 and 239 and inductors 235 and 237.

Figure 2A:
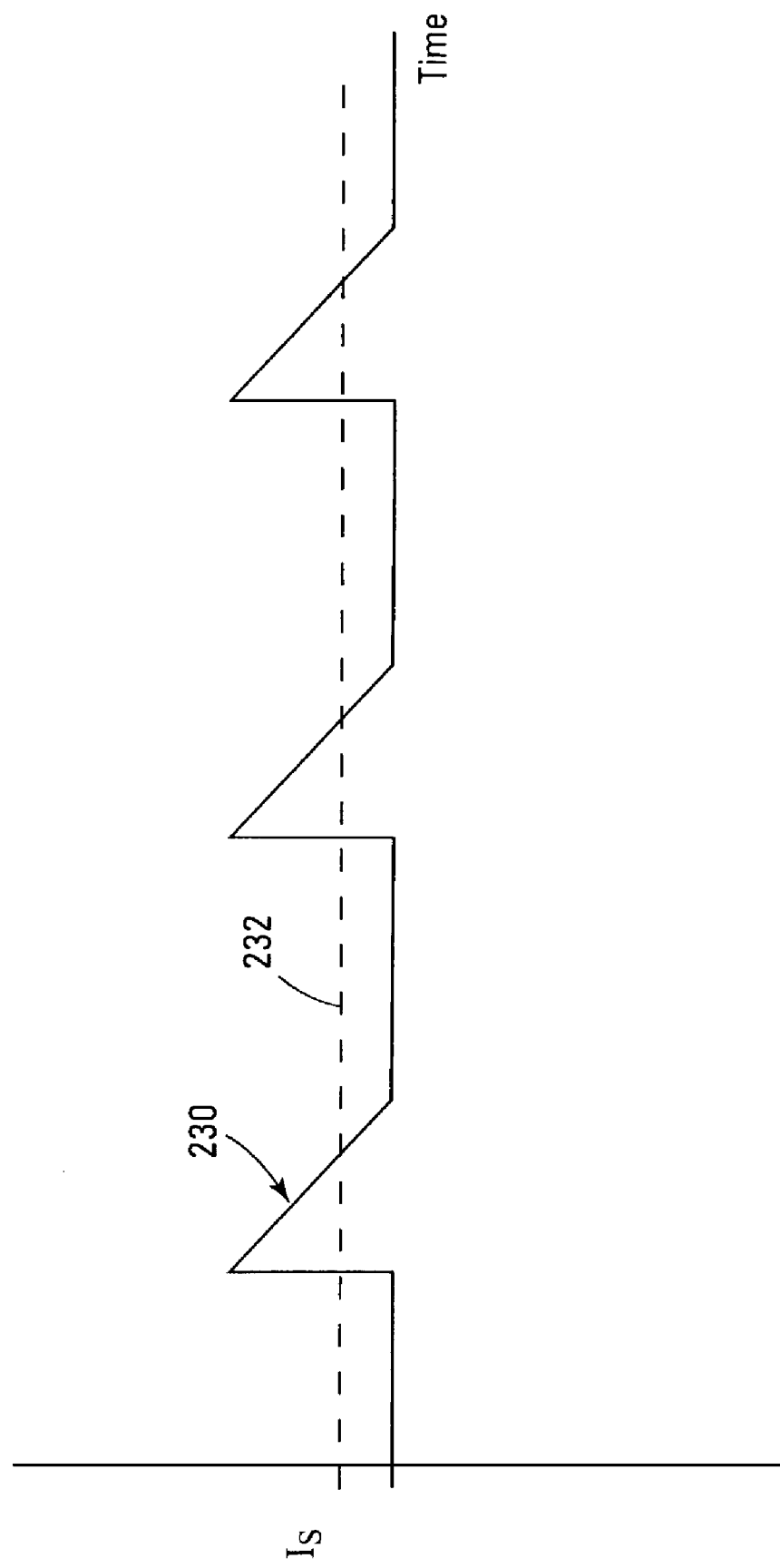
FIG. 2A is a plot of an output signal from a power supply of one embodiment of the present invention.
Figure 2B:
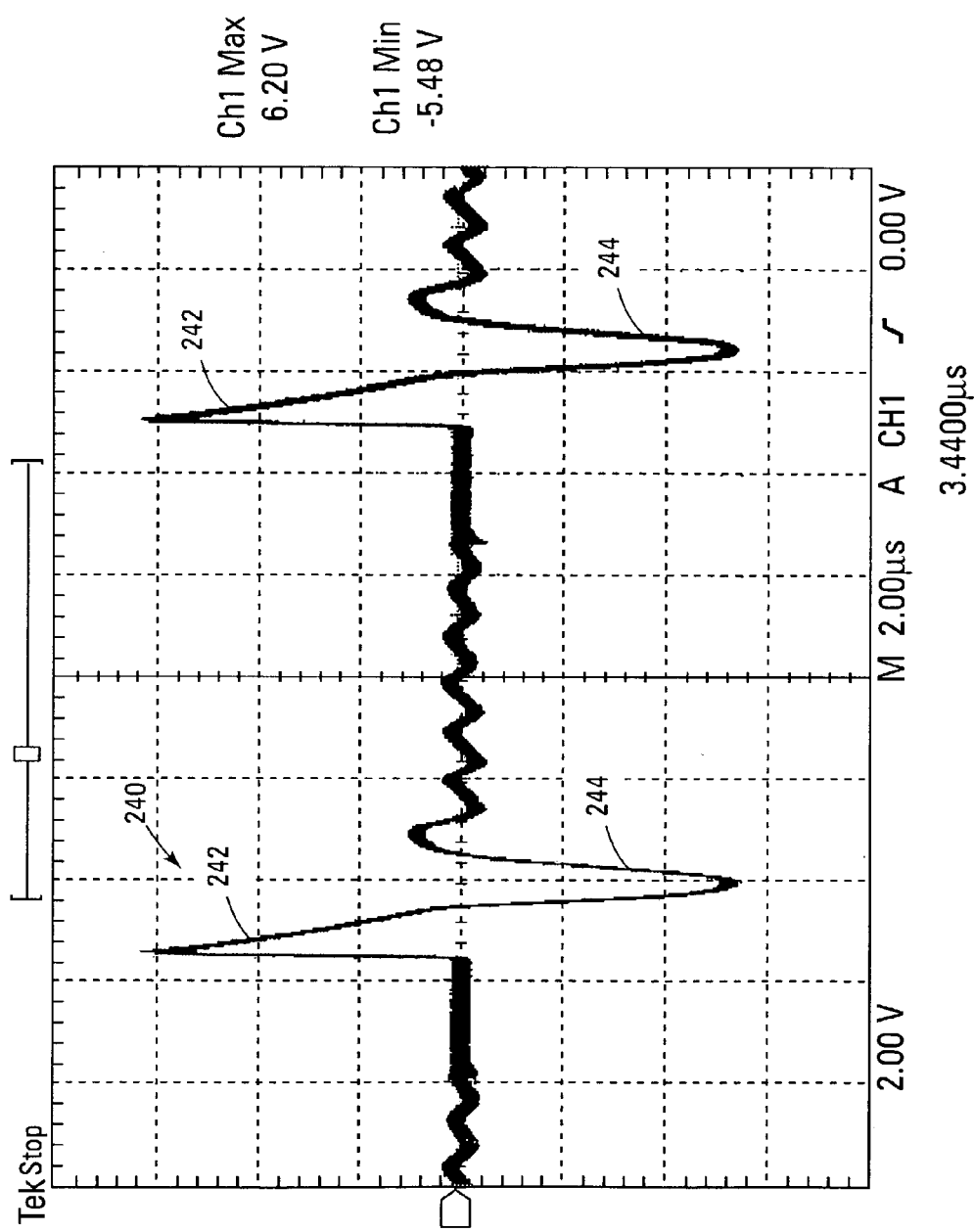
FIG. 2B is a plot of a signal from the secondary coils of a current sense transformer of one embodiment of the present invention.
Figure 2C:
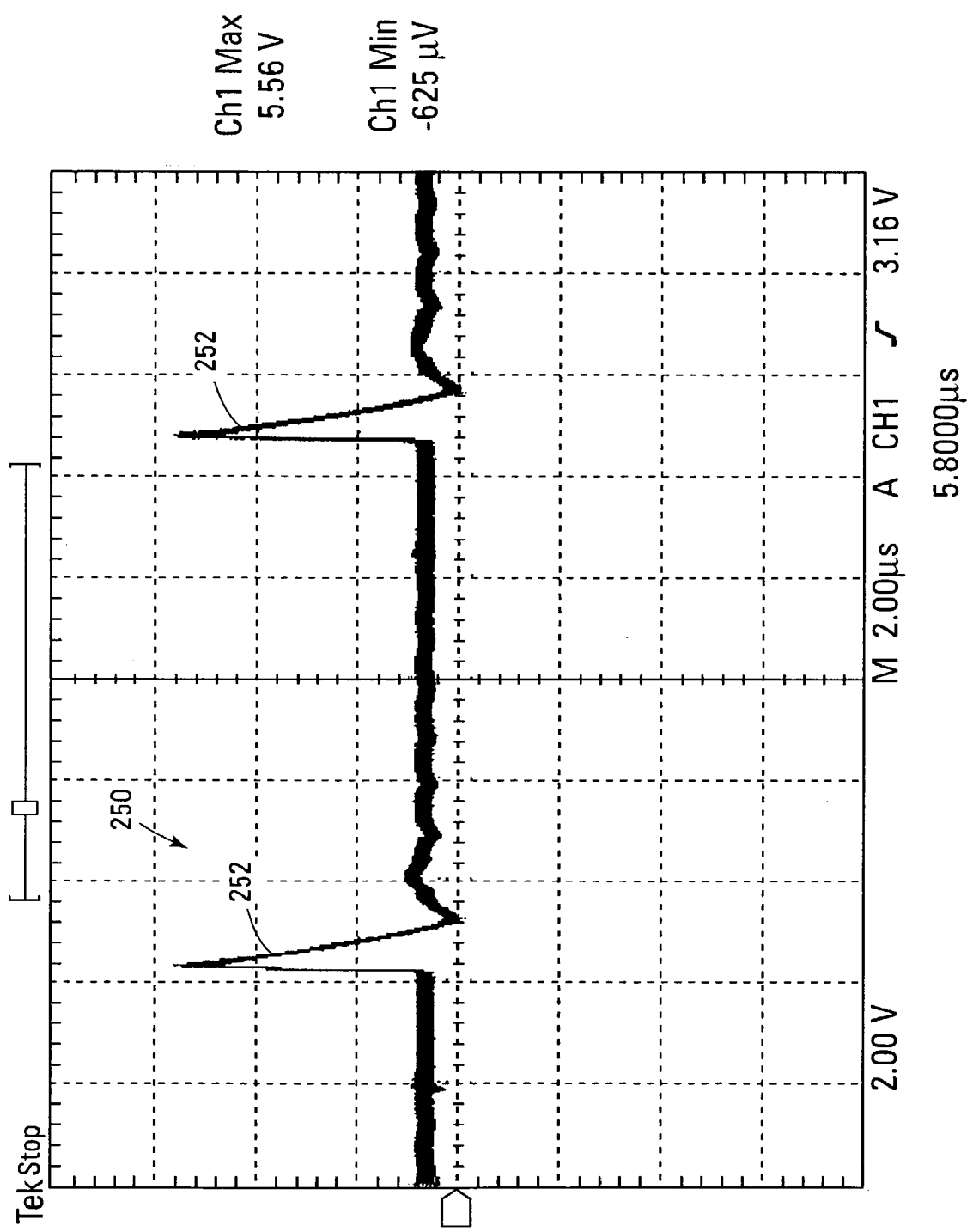
FIG. 2C is a plot of a rectified signal of one embodiment of the present invention.
Figure 2D:
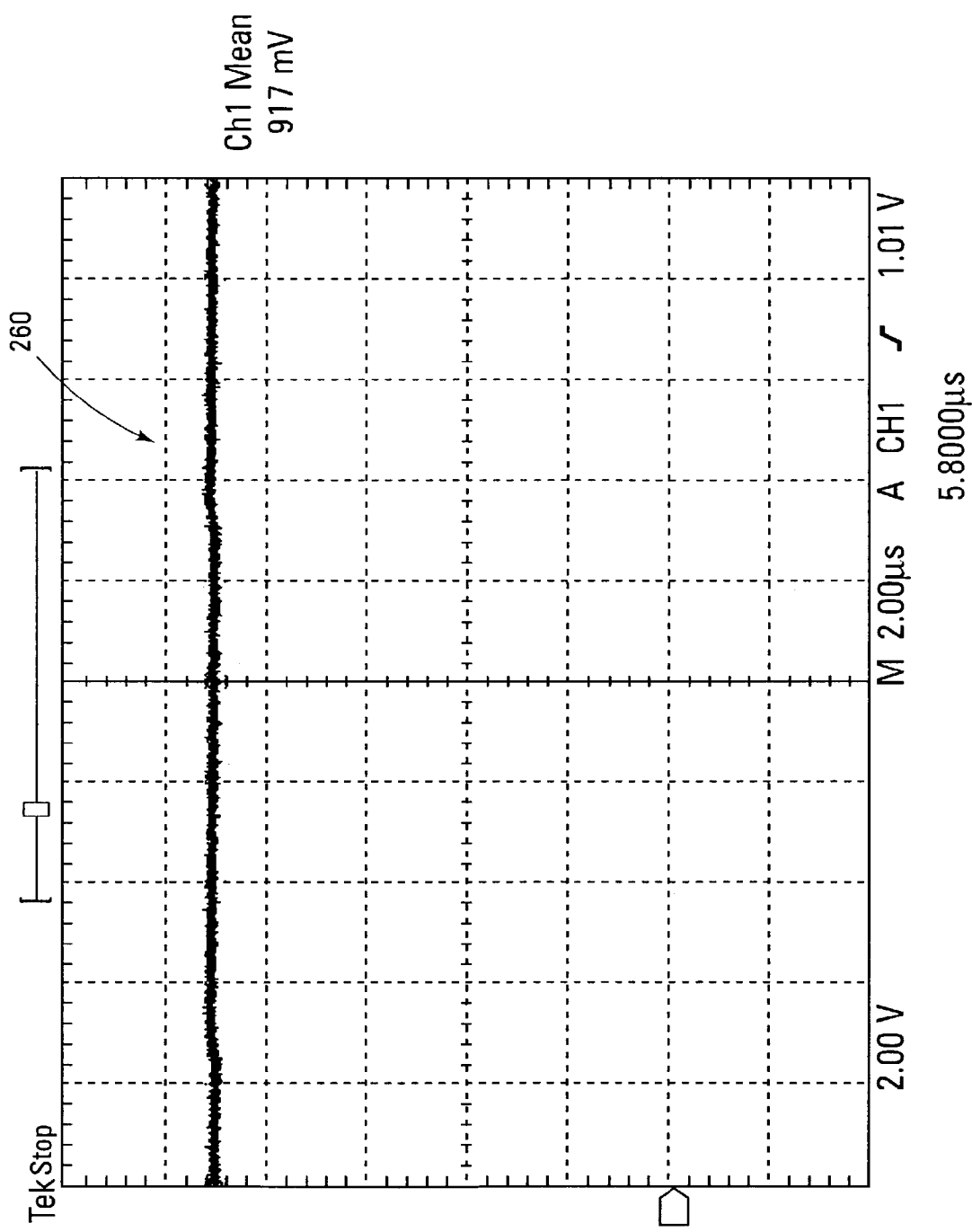
FIG. 2D is a plot of a sense signal of one embodiment of the present invention.

An example of the output current 230 received from a power supply 102 at node 201 is illustrated in FIG. 2A. Also illustrated in FIG. 2A is the average current value 232. This is the output current signal 230 that is applied to the primary coils of the current sense transformer 208. FIG. 2B illustrates a corresponding signal 240 off of the secondary coils of the of the current sense transformer 208. As illustrated, signal 240 includes voltage pulses 242 which are proportional to the current waveform. Moreover, signal 240 also includes a core reset pulses 244 which are the result of the demagnetization of the core of the current sense transformer 208 between pulses. The core reset pulses 208 are removed from the signal by diode 214. In particular, FIG. 2C illustrates a signal 250 having voltage pulses 252 and the core reset pulses removed by diode 214 (i.e. diode 214 rectifies signal 240). Signal 250 then passes through the low pass filter (resistor 218 and capacitor 220) to produce the sense signal 260. The sense signal 260 is a measured DC value that is proportional to the output current.

Referring back to FIG. 1, as stated above the controller 106 receives the sense signal from the sense circuit that is representative of the current output from the power supply 102. In one embodiment, the controller 106 compares the received signal with a reference signal and provides a status signal based on the comparison. In another embodiment, the controller 106 is adapted to compare the received signal with two different reference signals in providing a status signal based on whether the received signal falls either between the two references signals or outside the reference signals. Further in one embodiment, if the received signal is determined to be outside a range set by two reference signals in the controller 106, the controller sets off an alarm 116 with one of the one or more controller output signals. This is illustrated in FIG. 1. The alarm 116 sets off a warning to a technician that a current level in the twisted pair drop is either below or above a desired current level. This gives notice to the technician that a condition, such as a short in the lines, needs to be repaired.

Figure 3:
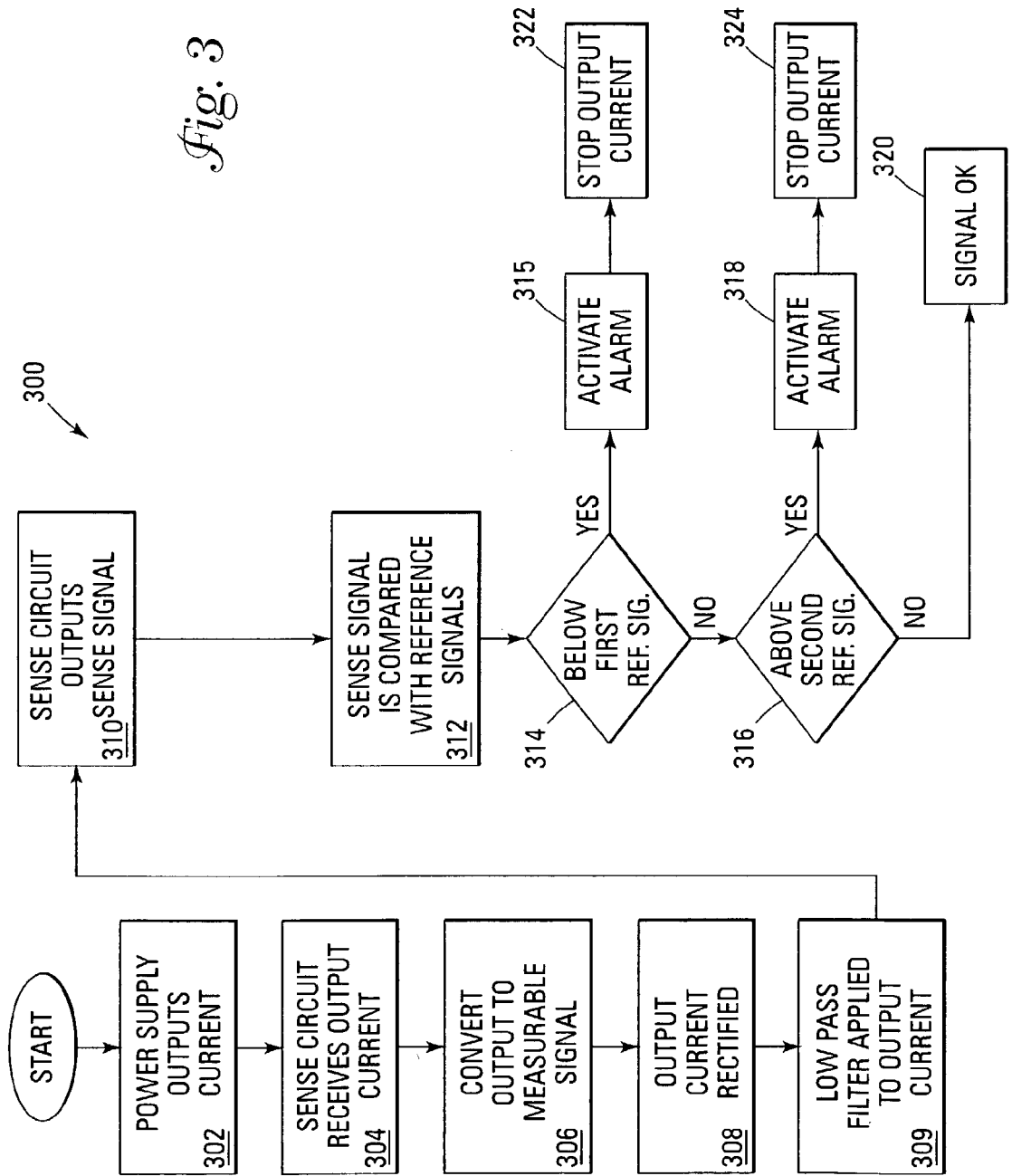
FIG. 3 is a flow chart illustrating one method of one embodiment of the present invention.

A flow chart illustrating one method of operating one embodiment of the present invention is illustrated in FIG. 3. As illustrated, the power source outputs an output current (302). The output current of the power source is coupled to a sense circuit (304). The sense circuit converts the output signal to a measurable signal (306), rectifies the output current (308) and then passes the output current through a low pass filter (309) to create a sense signal wherein a measured DC value is proportional to the output current of the power supply. The sense signal is then output by the sense circuit (310). A controller then receives the sense signal and compares it with reference signals (312). If the sense signal is below a first select low reference signal (314) an alarm is set off (315) notifying a technician that there is a problem. The controller, in one embodiment, also signals the power supply to stop the output current (322). If the sense signal is higher than a second select high reference signal (316) an alarm is set off (318) thereby notifying a technician that there is a problem. The controller, in one embodiment, also signals the power supply to stop the output current (324). If the sense signal is in between the first select low reference signal and the second select high reference signal the sense signal is within an acceptable range (320). Since the sense signal is representative of the output current from the power source, the current in an associated twisted line pair drop will be within a desired range. In the above embodiment, when the sense signal was found to be outside of the desired range an alarm was triggered. In another embodiment, when the sense signal is found to be outside the range the controller is adapted to adjust the power source until a desired output current is achieved. In yet another embodiment, both an alarm and an adjustment of the power source are implemented.

Figure 4:
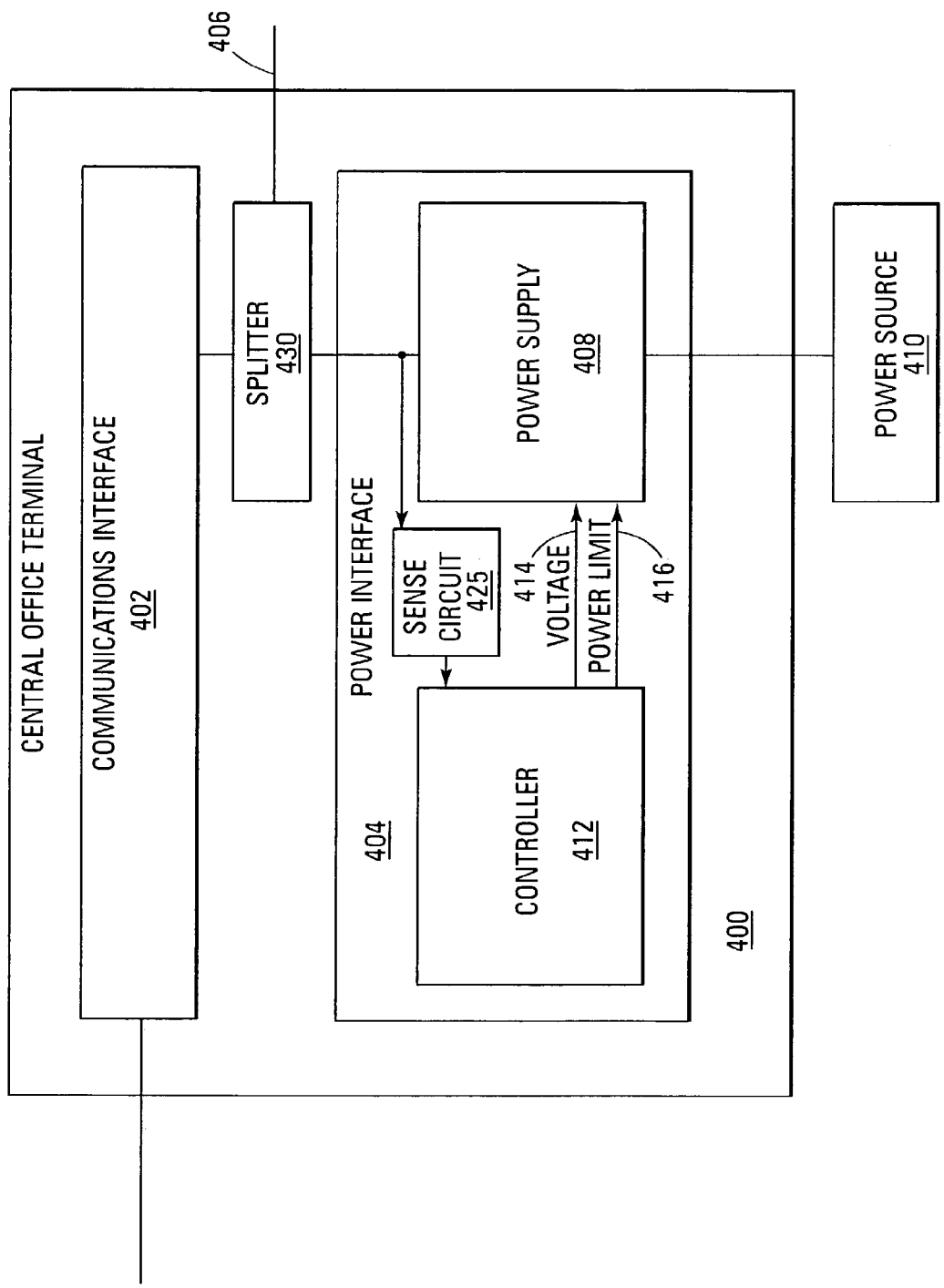
FIG. 4 is a block diagram of a central office of one embodiment of the present invention.

To provide further understanding of the present invention, a block diagram of one embodiment of a central office terminal 400 is illustrated in FIG. 4. Embodiments of central office terminal 400 are suitable for providing power to one or more remote terminals (or other network elements) over one or more twisted-pair telephone lines (or other communication medium). The embodiment of a central office terminal 400 shown in FIG. 4 includes communication interface 402 and a power interface 404. The communication interface 402 includes appropriate components for providing the various telecommunications service provided by the central office terminal 400. For example, in the embodiment shown in FIG. 4, the communications interface 402 couples the central office terminal 400 to at least one upstream G.SHDSL communication link and to at least one downstream G.SHDSL communication link (via a splitter 430 described below). The downstream G.SHDSL communication links is provided over at least one twisted-pair telephone line 406. The twisted-pair telephone line 406 is coupled, in one embodiment to one or more remote terminals (not shown in FIG. 2) that are powered by the central office terminal 400.

The power interface 404 includes a power supply 408 that is coupled to a power source 410. In general, the power supply 408 receives power from the power source 410 and conditions and supplies power on the twisted-pair telephone lines 406 in order to power a remote terminal coupled to the twisted-pair telephone line 406. In one such embodiment, the power supply 408 is implemented as a fly-back power supply. The central office terminal 400 includes a splitter 430 that combines an output communication signal from the communications interface 402 and an output power signal from the power interface 404 and applies the combined output signal to the twisted-pair telephone line 406. The splitter 430 also receives an input signal from the twisted-pair telephone line 406 and splits off that portion of the received input signal used for providing the downstream communication link and provides it to the communications interface 402 for appropriate processing. One embodiment of a splitter 430 is described in a co-pending application entitled "SPLITTER", Ser. No. 10/449,546.

The power interface 404 also includes a controller 412 that controls the operation of the power supply 408. In one such embodiment, controller 412 is implemented in hardware (for example, using analog and/or digital circuits) and/or in software (for example, by programming a programmable processor with appropriate instructions to carry out the various control functions described here). In other embodiments, the controller 412 is implemented in other ways. Although the controller 412 is shown as being a part of the power interface 404 in FIG. 4, in other embodiments the controller 412 is a part of a general controller or control circuitry for the central office terminal 400. In other embodiments, the functions performed by the controller 412 are incorporated directly into control circuitry of the power supply 408.

In the embodiment shown in FIG. 4, a voltage signal 414 is provided between the controller 412 and the power supply 408. The voltage signal 414 is used by the controller 412 to set a nominal voltage at which the power supply 408 is to supply power on the twisted-pair telephone line 406 in order to power a remote terminal coupled to the twisted-pair telephone line 406. A power limit signal 416 is provided between the controller 412 and the power supply 408. The power limit signal 416 is used by the controller 412 to set a power limit for the power supply 408. The power limit is a maximum power the power supply 208 is to provide on the twisted-pair telephone line 406. The sense circuit 425 measures the output current of the power supply and provides a sense signal to the controller 412 that is representative of the current in the twisted-pair drop 406 (twisted-pair telephone line 406). The controller 412 processes the sense signal and makes an appropriate response. Although, the sense circuit of FIG. 4 is illustrated as being in the power interface 404 in the embodiment of FIG. 4, in other embodiments, the sense circuit is located outside the power interface 404. In further embodiments, the sense circuit is located in the controller 412.

Figure 5:
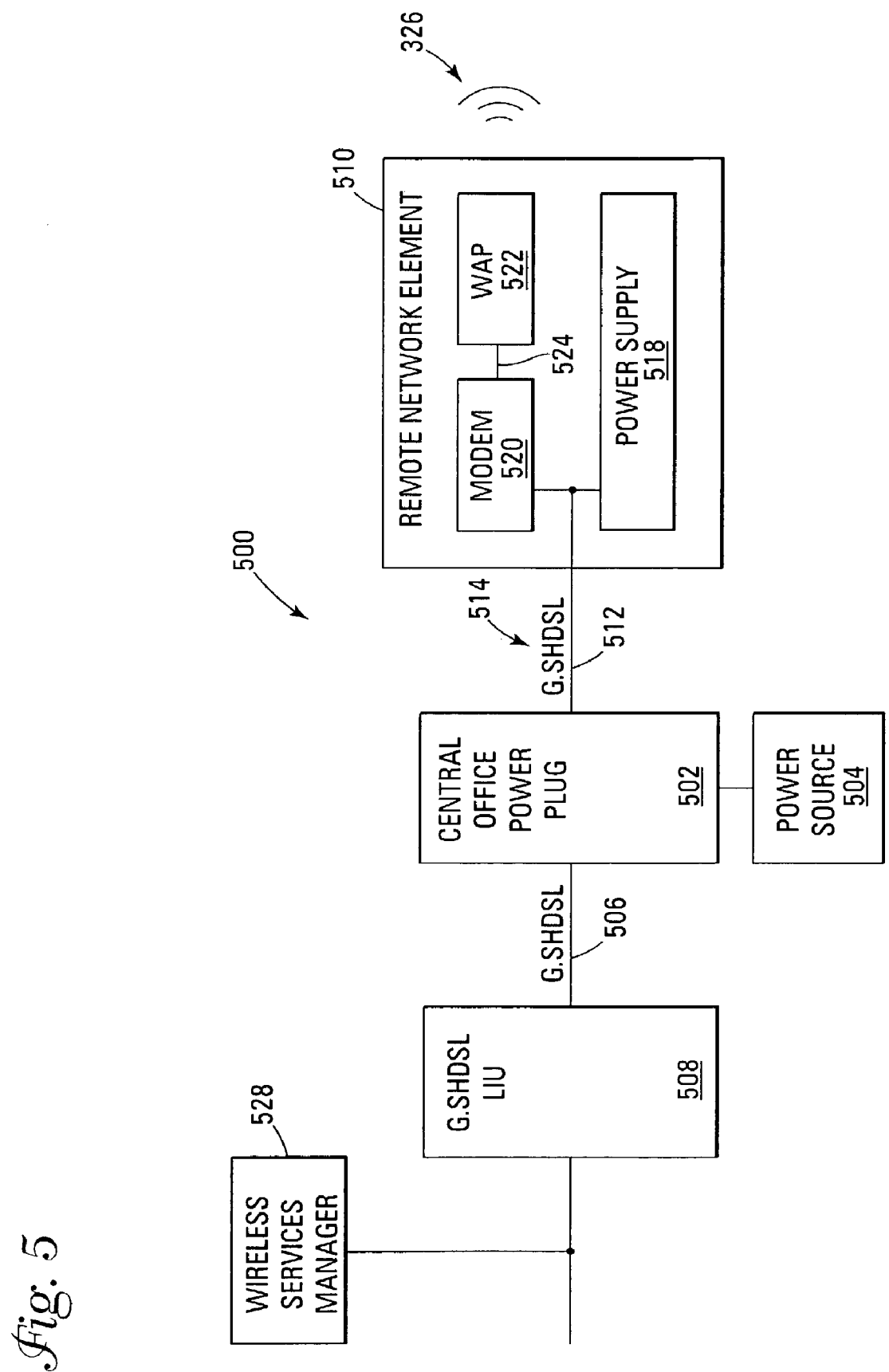
FIG. 5 is a block diagram of a wireless network of one embodiment of the present invention.

FIG. 5 is a block diagram of one embodiment of a wireless network 500. The embodiment of a wireless network 500 shown in FIG. 5 includes a central office power plug 502 that is coupled to a power source 504. In one embodiment, central office power plug 502 is implemented using an embodiment of the central office terminal 500 described above. An upstream G.SHDSL communication link 506 is provided to the central office power plug 502 over an upstream communication medium (for example, a twisted-pair telephone line). The upstream G.SHDSL communication link 506 couples the central office power plug 502 to a G.SHDSL line interface unit 508. The G.SHDSL line interface unit 508 is coupled to an upstream network (not shown) such as the Internet. In one such embodiment, the G.SHDSL line interface units 508 is inserted into a subscriber access multiplexer (not shown) in order to couple the G.SHDSL line interface unit 508 to the upstream network.

The wireless network 500 also includes a remote network element 510. Remote network element 510 is powered by a twisted-pair telephone line 512 that is coupled between the central office power plug 502 and the remote network element 510. A downstream G.SHDSL communication link 514 is provided over the twisted-pair telephone line 512. The central office power plug 502 supplies power for the remote network element 510 on the twisted-pair telephone line 512 in the same manner as described above in connection with FIG. 4. The remote network element 510 includes a power supply 518 that is coupled to the twisted-pair telephone line 512. The power supply 518 extracts the power supplied on the twisted-pair telephone line 512 by the central office power plug 502. The extracted power is used to power various components of the remote network element 510.

The remote network element 510 also includes a G.SHDSL modem 520 that modulates and demodulates the G.SHDSL signals carried over the twisted-pair telephone line 512. The modem 520 is coupled to a wireless access point 522 over an Ethernet connection 524. The wireless access point 522 transmits traffic to, and receives traffic from various wireless devices (not shown) over a wireless link 526. Examples of wireless devices include computers or personal digital assistants having wireless transceivers. In one embodiment, the wireless access point 522 is a wireless access point that supports the Institute for Electrical and Electronic Engineers (IEEE) 802.11b standard (also referred to as "WI-FI").

The wireless network 500 also includes a wireless services manager 528 that manages the wireless services provided over the wireless network 500. For example, in one embodiment, wireless services manager 528 manages authentication and other subscriber and service-related information using the Remote Authentication Dial-in User Service (RADIUS) protocol. In one embodiment, the wireless services manager 528 is coupled to the G.SHDSL line interface unit 508 using a local area network connection (for example, an Ethernet connection).

In operation, wireless traffic is received by the wireless access point 522 from various wireless devices. The wireless traffic is transmitted to the central office power plug 502 by the G.SHDSL modem 520 over the twisted-pair telephone line 512. A splitter (not shown in FIG. 5) splits off that portion of the signal used for providing the G.SHDSL communication link and provides it to a communications interface (not shown in FIG. 5) of the central office power plug 502 for appropriate processing. The communications interface transmits the traffic to the G.SHDSL line interface unit 508 over the upstream G.SHDSL communication link 506, where the traffic is processed and forwarded to the upstream network by the line interface unit 508. In the downstream direction, traffic is received by the G.SHDSL line interface unit 508 from the upstream network. The traffic is transmitted to the central office power plug 502 over the upstream communication link 506. The traffic is combined with power from a power supply (not shown in FIG. 5) of the central office power plug 502 by the splitter and the combined signal is transmitted on the twisted-pair telephone line 512. The signal is received by the G.SHDSL modem 520, which forwards the traffic to the wireless access point 522 for transmission to the wireless devices.

A number of embodiments of the invention defined by the following claims have been described. Nevertheless, it will be understood that various modifications to the described embodiments may be made without departing from the scope of the claimed invention. Accordingly, other embodiments are within the scope of the following claims.

What is claimed is:

1. A current sense circuit in a line power network element, the current sense circuit comprising:
   an input node coupled to receive an output current from a power supply;
   a pass node coupled to pass the output current to a signal combining circuit;
   a current to voltage conversion circuit coupled to the input node to provide a measurable signal proportional to the output current;
   a rectifying circuit coupled to the conversion circuit;
   a low pass filter circuit coupled to the rectifying circuit; and a signal node coupled to the low pass filter circuit, wherein a sense signal representative of the output current is coupled to the signal node.

2. The current sense circuit of claim 1, wherein the current to voltage conversion circuit further comprises:
one or more transformers.

3. The current sense circuit of claim 2, wherein each of the one or more transformers has a primary winding side with one turn.

4. The current sense circuit of claim 1, wherein the sense signal is an analog output signal that is representative of the output current provided by the power supply.

5. A current sense system in a line power network, the current sense system comprising:
a power supply adapted to supply output current to a twisted pair drop;
a splitter adapted to combine communication signals and the output current on a twisted pair drop; and
a sense circuit coupled to sample the output current of the power supply between the power supply and the splitter, wherein the sense circuit is adapted to output a sense signal that is representative of the output current.

6. The current sense system of claim 5, wherein the sense signal from the sense circuit provides a DC value proportional to the output current.

7. The current sense system of claim 5, wherein the sense circuit is adapted to convert the output current to a measurable signal.

8. The current sense system of claim 5, further comprising:
a controller adapted to selectively output one or more controller output signals in response to the sense current from the sense circuit.

9. The current sense system of claim 8, wherein the one or more controller signals adjust the power supply.

10. The current sense circuit of claim 8, wherein the controller further comprises:
a comparator circuit adapted to compare the sense signal with one or more reference signals.

11. The current sense circuit of claim 8, wherein one of the one or more controller outputs directs the power supply to stop generating the output current.

12. The current sense system of claim 8, further comprising:
an alarm coupled to the controller, wherein one of the one or more controller output signals activate the alarm when a select condition is measured in the sense signal.

13. The current sense system of claim 12, wherein the select condition is when the sense current is outside a selected range of current values.

14. A method of sensing current in a twisted pair drop in a line power network, the method comprising:
coupling an output current of a power supply to a sense circuit;
converting the output current to a measurable signal;
filtering the output current with a low pass filter;
outputting a sense signal that is representative of the output current of the power supply; and
passing the output current on to a signal combining circuit.

15. The method of claim 14, further comprising:
converting the sense signal from an AC analog signal to a DC signal; and
comparing the sense signal with one or more reference signals.

16. The method of claim 15, further comprising;
setting off an alarm if the sense signal is outside a range of the one or more reference signals.

17. The method of claim 15, further comprising:
adjusting the output current if the sense signal is outside a range of the one or more reference signals.

18. A method of controlling current in a twisted pair drop of a line powered network, the method comprising:
generating an output current from a power supply in a network element;
coupling the output current to a splitter that is adapted to combine the output current and communication signals to a twisted pair drop in a downstream communication link;
sampling the output current between the power supply and the splitter; and
generating a sense signal from the sampled output current that is indicative of the output current.

19. The method of claim 18, further comprising:
using the sense signal to determine the output current being applied to the twisted pair drop.

20. The method of claim 18, wherein the downstream communication link is a G.SHDSL communication link.

21. The method of claim 18, wherein generating the sense signal further comprises:
converting the output current to a measurable signal; and
filtering the output current with a low pass filter.

22. The method of claim 18, further comprising:
converting the sense signal from an AC signal to a DC signal; and
comparing the sense signal with one or more reference signals.

23. The method of claim 22, further comprising;
setting off an alarm if the sense signal is outside a range of the one or more reference signals.

24. The method of claim 22, further comprising:
adjusting the output current of the sense signal is outside a range of the one or more reference signals.

25. The method of claim 22, further comprising:
stopping the output current if the sense signal is outside a range of the one or more reference signals.

* * * * *